(12) United States Patent
Chow et al.

(10) Patent No.: US 9,151,610 B2
(45) Date of Patent: Oct. 6, 2015

(54) VALIDATING CALIBRATED MAGNETOMETER DATA

(71) Applicant: Apple Inc., Cupertino, CA (US)

(72) Inventors: Sunny Kai Pang Chow, San Jose, CA (US); Xiaoyuan Tu, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 93 days.

(21) Appl. No.: 13/913,420

(22) Filed: Jun. 8, 2013

(65) Prior Publication Data

US 2014/0361763 A1    Dec. 11, 2014

(51) Int. Cl.
*G01R 35/00*  (2006.01)
*G01C 17/38*  (2006.01)
*G01R 33/02*  (2006.01)

(52) U.S. Cl.
CPC ............. *G01C 17/38* (2013.01); *G01R 33/02* (2013.01)

(58) Field of Classification Search
CPC .. G01R 33/02; G01R 35/005; G01R 33/0035; G01R 33/022; G01R 33/028; G01R 33/09; B60R 2021/01327; B60R 21/0132; G01C 21/16; G01C 21/20
See application file for complete search history.

(56) References Cited

U.S. PATENT DOCUMENTS

| | | | |
|---|---|---|---|
| 5,075,693 A | 12/1991 | McMillan et al. | |
| 5,165,269 A | 11/1992 | Nguyen | |
| 5,349,529 A | 9/1994 | Masumoto et al. | |
| 5,761,094 A | 6/1998 | Olson et al. | |
| 5,946,813 A | 9/1999 | Nachbaur et al. | |
| 6,204,804 B1 * | 3/2001 | Andersson | 342/113 |
| 6,311,098 B1 * | 10/2001 | Higasayama et al. | 700/159 |
| 6,311,129 B1 | 10/2001 | Lin | |

(Continued)

FOREIGN PATENT DOCUMENTS

| | | |
|---|---|---|
| EP | 1 221 586 | 7/2002 |
| JP | 2005-134343 | 5/2005 |

(Continued)

OTHER PUBLICATIONS

"Honeywell 3-Axis Digital Compass IC, HMC5843 Electronic Compass," Honeywell International Inc. [online]; retrieved from the Internet: <URL: http://www.honeywell.com/sites/portal?smap=aerospace&page=Magnetic-Sensors3&theme=T15&catID=CF84B17AB-A90F-716D-10BC-A1E75441138E&id=HF916B4E0-4F71-9DB5-DFA8-51B1944918EE&sel=2&se14=1>, retrieved on Jun. 5, 2005, 1 page.

(Continued)

*Primary Examiner* — Tung X Nguyen
(74) *Attorney, Agent, or Firm* — Fish & Richardson P.C.

(57) ABSTRACT

Implementations are disclosed for validating data retrieved from a calibration database. In some implementations, calibrated magnetometer data for a magnetometer of a mobile device is retrieved from a calibration database and validated by data from another positioning system, such as course or heading data provided by a satellite-based positioning system. In some implementations, one or more context keys are used to retrieve magnetometer calibration data from a calibration database that is valid for a particular context of the mobile device, such as when the mobile device is mounted in a vehicle. In some implementations, currently retrieved calibration data is compared with previously retrieved calibration data to determine if the currently retrieved calibration data is valid.

21 Claims, 7 Drawing Sheets

(56) References Cited

U.S. PATENT DOCUMENTS

| | | |
|---|---|---|
| 6,384,384 B1 | 5/2002 | Connolly et al. |
| 6,408,245 B1 | 6/2002 | An et al. |
| 6,424,914 B1 | 7/2002 | Lin |
| 6,508,316 B2 | 1/2003 | Estes et al. |
| 6,539,639 B2 | 4/2003 | Smith |
| 6,622,091 B2 | 9/2003 | Perlmutter et al. |
| 6,651,003 B2 | 11/2003 | Woloszyk et al. |
| 6,768,452 B2 | 7/2004 | Gilkes |
| 6,807,485 B1 | 10/2004 | Green |
| 6,834,528 B2 | 12/2004 | Kappi et al. |
| 6,964,107 B1 | 11/2005 | Ahola |
| 6,988,049 B1 | 1/2006 | Wirtz et al. |
| 7,196,660 B2 | 3/2007 | Abraham |
| 7,210,236 B2 | 5/2007 | Sato et al. |
| 7,248,983 B2 | 7/2007 | Fillatreau et al. |
| 7,275,008 B2 | 9/2007 | Plyvanainen |
| 7,324,906 B2 | 1/2008 | Sato et al. |
| 7,331,115 B2 | 2/2008 | Schierbeek et al. |
| 7,346,452 B2 | 3/2008 | Ford et al. |
| 7,388,541 B1 | 6/2008 | Yang |
| 7,391,366 B2 | 6/2008 | Park et al. |
| 7,400,974 B2 | 7/2008 | Fuchs et al. |
| 7,415,354 B2 | 8/2008 | Alexander |
| 7,451,549 B1 | 11/2008 | Sodhi et al. |
| 7,458,166 B2 | 12/2008 | Parks et al. |
| 7,548,200 B2 | 6/2009 | Garin |
| 7,565,839 B2 | 7/2009 | Stewart et al. |
| 7,891,103 B2 | 2/2011 | Mayor et al. |
| 8,061,049 B2 | 11/2011 | Mayor et al. |
| 8,432,156 B2 | 4/2013 | Almalki et al. |
| 8,437,970 B2 | 5/2013 | Mayor et al. |
| 2003/0135327 A1 | 7/2003 | Levine et al. |
| 2005/0154532 A1* | 7/2005 | Close et al. ............ 702/6 |
| 2005/0174324 A1 | 8/2005 | Liberty et al. |
| 2005/0223575 A1 | 10/2005 | Fillatreau et al. |
| 2005/0240347 A1 | 10/2005 | Yang |
| 2005/0246099 A1 | 11/2005 | Jendbro et al. |
| 2005/0288805 A1 | 12/2005 | Moore |
| 2006/0066295 A1 | 3/2006 | Tamura et al. |
| 2006/0190174 A1 | 8/2006 | Li et al. |
| 2006/0195254 A1 | 8/2006 | Ladetto et al. |
| 2006/0212182 A1 | 9/2006 | Shaw |
| 2006/0271295 A1 | 11/2006 | McLaren et al. |
| 2007/0103461 A1 | 5/2007 | Suzuno et al. |
| 2007/0156337 A1 | 7/2007 | Yanni |
| 2008/0066331 A1 | 3/2008 | Brzezinski et al. |
| 2008/0143595 A1 | 6/2008 | Colley et al. |
| 2008/0147686 A1 | 6/2008 | Colley et al. |
| 2008/0201096 A1 | 8/2008 | Wright et al. |
| 2009/0033807 A1 | 2/2009 | Sheng et al. |
| 2009/0054075 A1 | 2/2009 | Boejer |
| 2009/0070058 A1 | 3/2009 | Lin |
| 2009/0089001 A1 | 4/2009 | Lin |
| 2009/0164067 A1 | 6/2009 | Whitehead et al. |
| 2009/0171607 A1 | 7/2009 | Chen et al. |
| 2009/0172599 A1 | 7/2009 | Nezu |
| 2009/0326851 A1 | 12/2009 | Tanenhaus |
| 2010/0121599 A1 | 5/2010 | Boeve et al. |
| 2010/0188276 A1 | 7/2010 | Griffith et al. |
| 2010/0305853 A1 | 12/2010 | Schulze et al. |
| 2011/0106474 A1 | 5/2011 | Kulik et al. |
| 2012/0206129 A1 | 8/2012 | Mahan et al. |
| 2013/0320966 A1 | 12/2013 | Oliver et al. |
| 2014/0361763 A1 | 12/2014 | Chow et al. |

FOREIGN PATENT DOCUMENTS

| | | |
|---|---|---|
| JP | 2006-058060 | 3/2006 |
| JP | 2009-192495 | 8/2009 |
| JP | 2010-054431 | 3/2010 |
| WO | WO 2005/040991 | 5/2005 |
| WO | WO 2008/122904 | 10/2008 |
| WO | WO 2009/068116 | 6/2009 |

OTHER PUBLICATIONS

Adiprawita et al., "Development of AHRS (Attitude and Heading Reference System) for Autonomous UAV (Unmanned Aerial Vehicle)," *Proc Int'l Conf Electrical Engineering and Informatics*, Institut Teknologi Bandung, Indonesia, Jun. 17-19, 2004, 4 pages.

An Overview of the Earth's Magnetic Field, "The Earth's Magnetic Field—An Overview", [Online] [Retrieved on May 16, 2009]. Retrieved from the Internet: URL: http://www.geomag.bgs.ac.uk/earthmag.html, 10 pages.

Apptism, Compass Go, © 2009 Apptism, [Online] [Retrieved on Jun. 3, 2009]. Retrieved from the Internet: URL: http://www.apptism.com/apps/compass-go, 2 pages.

Apptism, Focalware, © 2009 Apptism, [Online] [Retrieved on Jun. 3, 2009]. Retrieved from the Internet: URL: http://www.apptism.com/apps/focalware, 2 pages.

Apptism, iTopoMaps, © 2009 Apptism, [Online] [Retrieved on Jun. 2, 2009]. Retrieved from the Internet: URL: http://www.apptism.com/apps/itopomaps, 4 pages.

Authorized officer Adina-Gabriela Otinjac, International Search Report/Written Opinion mailed May 25, 2011, 22 pages.

Authorized officer Luis-Miguel Paredes Sanchez, Invitation to Pay Additional Fees and, where applicable, protest fee, in PCT/US2010/050219 mailed Jan. 19, 2011, 5 pages.

Camps et al., "Numerical Calibration for 3-Axis Accelerometers and Magnetomors," *IEEE*, 2009, pp. 217-231.

Chris M. Goulet, "Magnetic Declination, Frequently Asked Questions", Oct. 2001, Version 4.4, [Online] [Retrieved on May 16, 2009]. Retrieved from the Internet: URL: http://www.geocities.com/magnetic_declination/, 16 pages.

Harper et al., "Process for Improving GPS acquisition assistance data and server-side location determination for cellular networks," *2004 Intl Symp on GNSS/GPS*, Dec. 6-8, 2004, Sydney, Australia, 15 pages.

PNI Sensor Corporation, "Calibration Computations for Practical Compassing using the PNI-11096 Magnetometer ASIC", Aug. 2008, PNI Corporation © 2001, Santa Rosa, CA, 3 pages.

PNI Sensor Corporation, "Multipoint Calibration Primer", (no publication date available), PNI Corporation, Santa Rosa, CA, 10 pages.

Seong Yun Cho et al., "A Calibration Technique for a Two-Axis Magnetic Compass in Telematics Devices", Jun. 2005, ETRI Journal, vol. 27, No. 3, pp. 280-288.

The Earth's magnetic field, EPS 122: Lecture 5—Earth's magnetic field, 11 pages.

Westerberg, "Compass Go," Apple Apps Store, Oct. 10, 2008, 3 pages.

Zhang and Gao, "A Novel Auto-calibration Method of the Vector Magnetometer," *Ninth Intl Conf on Electronic Measurement & Instruments*, ICEMI '2009, pp. 1-145 through 1-150.

* cited by examiner

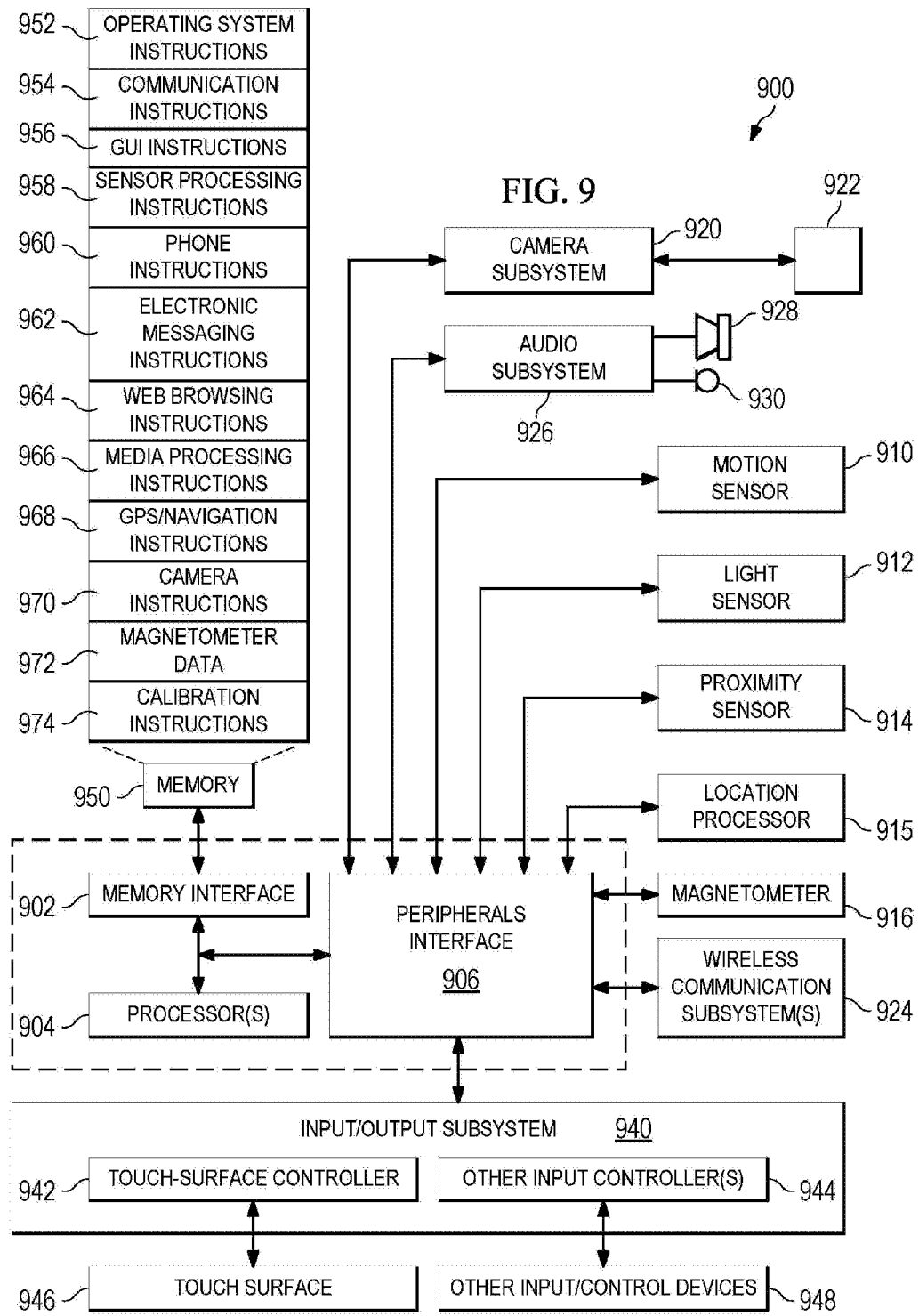

VALIDATING CALIBRATED MAGNETOMETER DATA

TECHNICAL FIELD

This disclosure relates generally to magnetometer bias estimation.

BACKGROUND

A mobile device (e.g., smart phone, navigational device, notebook computer, electronic tablet, wearable computer) can be equipped with a magnetometer. Magnetic readings from the magnetometer can be used to provide a user with a direction, which may be a "heading" (typically given relative to the Earth's true North), and/or an arrow pointing to true North. The direction information may be provided for the user's own navigation knowledge, for example, to tell the user which way is north while the user is walking or driving in unfamiliar surroundings. The direction information can also be used by a navigation or map application that may be running on the mobile device.

The magnetometer obtains a measure of the magnetic field that is present in the immediate surroundings of the mobile device as a two or three-component vector in a Cartesian coordinate system using 2-axis or 3-axis magnetic sensors. The sensed magnetic field can contain a contribution of the Earth's magnetic field and a contribution by a local interference field (device co-located interference fields). The latter is a magnetic field that is created by components in the local environment of the mobile device. This may include contributions by one or more magnetic field sources that are near the magnetic sensors, such as the magnet of a loudspeaker that is built into the mobile device. The interference field may also have a contribution due to one or more metal objects found in the external environment close to the device, such as when the user is driving an automobile, riding in a train or bus, or riding on a bicycle or motorcycle. In most cases, the interference field is not negligible relative to the Earth's magnetic field. Therefore, a calibration procedure is needed to reduce the adverse impact of the interference field contribution from the sensors' measurements to allow the magnetometer to calculate a more accurate direction.

There are several types of 3-axis calibration procedures. In one such technique, the user is instructed to rotate the mobile device (containing the magnetometer) according to a set of geometrically different orientations and azimuth angles, while measurements by the magnetometer and by an orientation sensor are collected and analyzed to isolate or quantify the interference field. The quantified interference field can then be subtracted from the measurement taken by the magnetic sensor to yield the Earth's geomagnetic field. The Earth's geomagnetic field can be further corrected to get the true north direction, such as correcting for magnetic variation (declination) due to the variation of the Earth's magnetic field based on geographic location.

In another 3-axis calibration technique, rather than instruct the user to rotate the mobile device in a predetermined manner, measurements are collected from the magnetometer, continuously over a period of time, while the mobile device is being used or carried by the user. This can lead to random (albeit sufficient) rotations of the mobile device, such that the magnetometer measurements define a desired, generally spherical measurement space. The sphere is offset from the origin of a coordinate system for the Earth's geomagnetic field vector by an unknown offset vector, which can represent a substantial part (if not all) of the interference field. Mathematical processing of the measurements can be performed to "re-center" the sphere by determining the offset vector. This technique is transparent to the user because the user is not required to go through a calibration procedure where the user deliberately rotates the device through a specified set of orientations.

The calibration techniques described above are effective but time consuming. As the user travels with the mobile device, the magnetometer will encounter different magnetic environments with varying local interference. These different magnetic environments can require a recalibration procedure and the calculation of a new offset vector. Even if the user returns to a previous location, a recalibration procedure may be required due to a change in the local interference field.

To avoid recalibrating the magnetometer for each use, a calibration database may be constructed with previously calibrated readings. In these instances, raw magnetometer data is compared to a lookup table of previously calibrated readings, including thresholds, to determine matches with the raw magnetometer data. If a match is found, the bias offset for the matching calibrated reading may be applied to the raw magnetometer data to determine an estimated geomagnetic field. The calibration database may include gaps such that no previously calibrated readings match the raw calibration data. These gaps in the calibration database may result in erroneous calibration data being used to calibrate the magnetometer readings resulting in large errors in heading estimates.

SUMMARY

Implementations are disclosed for validating data retrieved from a calibration database. In some implementations, calibrated magnetometer data for a magnetometer of a mobile device is retrieved from a calibration database and validated by data from another positioning system, such as course or heading data provided by a satellite-based positioning system. In some implementations, one or more context keys are used to retrieve magnetometer calibration data from a calibration database that is valid for a particular context of the mobile device, such as when the mobile device is mounted in a vehicle. In some implementations, currently retrieved calibration data is compared with previously retrieved calibration data to determine if the currently retrieved calibration data is valid.

In some implementations, a method comprises: receiving a reading from a magnetometer of a mobile device; selecting a cluster from a plurality of clusters of bias offsets generated from previously-calibrated readings, wherein the selected cluster has a representative bias offset, a mean of magnitudes in the selected cluster, and a magnitude threshold; estimating an external magnetic field based on the reading and the representative bias offset for the selected cluster; determining whether a magnitude of the estimated external field is within a magnitude range defined by the mean magnitude and the mean magnitude plus the magnitude threshold; determining a gravitation vector; determining an inclination angle between the gravitational vector and the estimated magnetic field; determining whether the inclination angle is within an angle range defined by a mean inclination angle for the selected cluster and the mean angle plus an angle threshold; determining the magnitude of the estimated external field matches the magnitude range and the inclination angle matches the angle range; determining a first heading for the mobile device using the estimated external field; comparing the first heading with a second heading obtained from data provided by a location processor of the mobile device; and validating the first heading in response to the comparing.

In some implementations, a method comprises: receiving a reading from a magnetometer of a mobile device; selecting, at a first time, a first cluster from a plurality of clusters of bias offsets generated from previously-calibrated readings, wherein the selected first cluster has a first representative bias offset, a first mean of magnitudes in the selected first cluster, and a first magnitude threshold; selecting, at a second time, a second cluster from a plurality of clusters of bias offsets generated from previously-calibrated readings, wherein the selected second cluster has a second representative bias offset, a second mean of magnitudes in the selected second cluster, and a second magnitude threshold; comparing the first and second representative bias offset; validating the second representative bias offset based on the comparing; estimating an external magnetic field based on the reading and the second representative bias offset for the selected second cluster; determining whether a magnitude of the estimated external field is within a magnitude range defined by the second mean magnitude and the second mean magnitude plus the second magnitude threshold; determining a gravitation vector; determining an inclination angle between the gravitational vector and the estimated magnetic field; determining whether the inclination angle is within an angle range defined by a mean inclination angle for the selected cluster and the mean angle plus an angle threshold; determining the magnitude of the estimated external field matches the magnitude range and the inclination angle matches the angle range; and determining a heading for the mobile device using the estimated external field.

In some implementations, a method comprises: receiving a reading from a magnetometer of a mobile device; selecting a cluster from a plurality of clusters of bias offsets generated from previously-calibrated readings, wherein the selected cluster has a representative bias offset, a mean of magnitudes in the selected cluster, and a magnitude threshold, where the selecting uses a context key; estimating an external magnetic field based on the reading and the representative bias offset for the selected cluster; determining whether a magnitude of the estimated external field is within a magnitude range defined by the mean magnitude and the mean magnitude plus the magnitude threshold; determining a gravitation vector; determining an inclination angle between the gravitational vector and the estimated magnetic field; determining whether the inclination angle is within an angle range defined by a mean inclination angle for the selected cluster and the mean angle plus an angle threshold; determining the magnitude of the estimated external field matches the magnitude range and the inclination angle matches the angle range; and determining a first heading for the mobile device using the estimated external field.

Particular implementations disclosed herein provide one or more of the following advantages. Validating magnetometer calibration data retrieved from a database prevent erroneous calibration data from being used to correct magnetometer readings, which could result in errors in computing a heading for the mobile device.

Other implementations are disclosed for systems, methods and apparatus. The details of the disclosed implementations are set forth in the accompanying drawings and the description below. Other features, objects, and advantages will be apparent from the description and drawings and from the claims.

DESCRIPTION OF DRAWINGS

FIG. 9 is a block diagram of exemplary architecture of a mobile device employing the processes of FIGS. 5-8 in accordance with some implementations.

The same reference symbol used in various drawings indicates like elements.

DETAILED DESCRIPTION

Raw Magnetic Field

Overview

Figure 1:
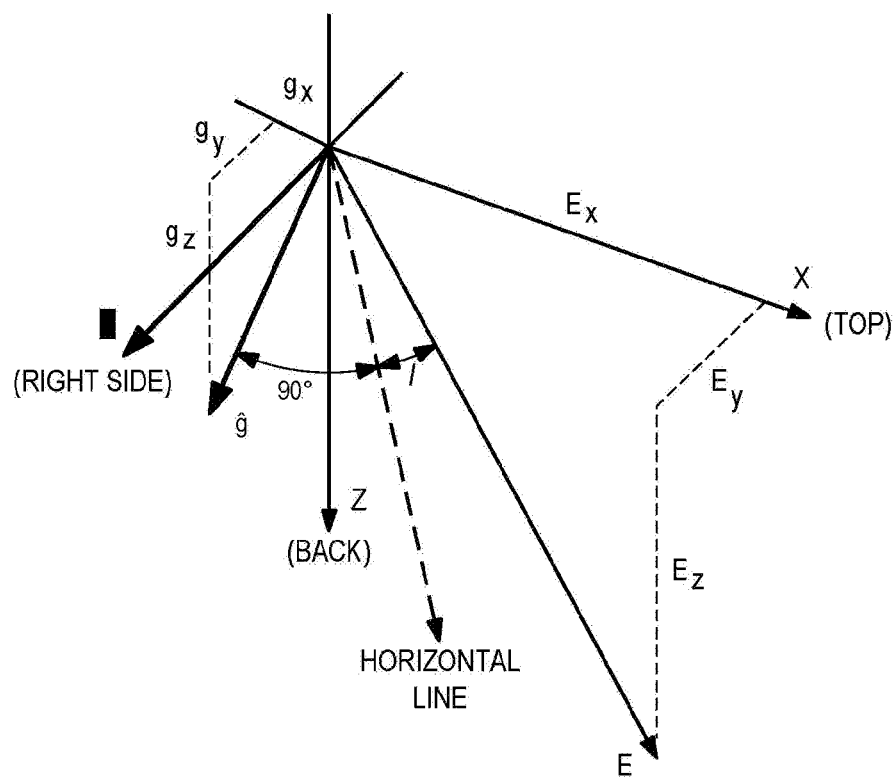
FIG. 1 illustrates an exemplary Cartesian coordinate system describing the Earth's geomagnetic field in accordance with some implementations.

FIG. 1 illustrates an exemplary Cartesian coordinate system for describing the Earth's geomagnetic field $\vec{E}$ in accordance with some implementations. The geomagnetic field vector $\vec{E}$ can be described, in device coordinates, by the orthogonal components $E_x$ (toward top of a mobile device), $E_y$ (toward right side of mobile device) and $E_z$ (back side of mobile device, positive downwards); the magnitude $|\vec{E}|$; and inclination (or dip relative to a horizontal line) I. Similarly, the gravitational acceleration vector $\vec{g}$ can be described by the orthogonal components $g_x$ (toward top of a mobile device), $g_y$ (toward right side of mobile device) and $g_z$ (backside of mobile device, positive downwards); and magnitude $|\vec{g}|$. The vectors $\vec{E}$ and $\vec{g}$, and the horizontal line are coplanar, and the intersection of $\vec{g}$ and the horizontal line form a 90° angle. The magnitude $|\vec{E}|$, the magnitude $|\vec{g}|$, and the inclination angle I can be computed from the orthogonal components using the following equations:

$$|\vec{E}| = \sqrt{E_x^2 + E_y^2 + E_z^2},\qquad [1]$$

$$|\vec{g}| = \sqrt{g_x^2 + g_y^2 + g_z^2}, \text{ and} \qquad [2]$$

$$I = 90 - \left(\cos^{-1}\left(\frac{\vec{E}\cdot\vec{g}}{|\vec{E}||\vec{g}|}\right) * \frac{180}{\pi}\right) \qquad [3]$$

The inclination angle I can be defined as the angle between the geomagnetic field $\vec{E}$ and the Earth's gravitational acceleration vector $\vec{g}$. The most commonly used International System of Units (SI) unit of magnetic-field magnitude is the Tesla.

Overview Of Magnetometers

Figure 2:
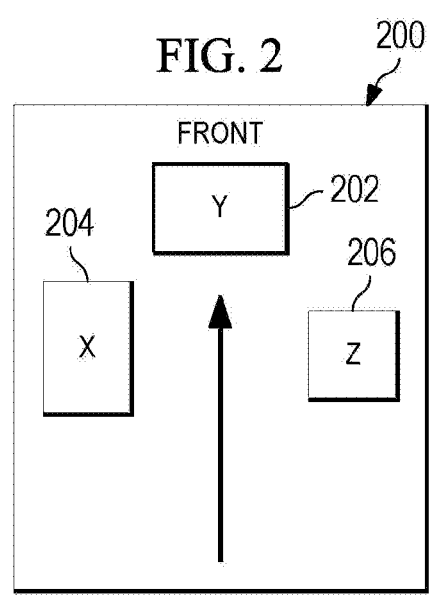
FIG. 2 illustrates an exemplary 3-axis magnetometer in accordance with some implementations.

FIG. 2 illustrates an exemplary 3-axis magnetometer in accordance with some implementations. In general, a magnetometer is an instrument that can sense the magnitude and direction of a magnetic field in its vicinity. Magnetometers can be 2-axis or 3-axis and the processes described here apply to both types of sensors. In the interest of brevity, only a 3-axis magnetometer is described.

In some implementations, 3-axis magnetometer sensor configuration 100 can be used to calculate a heading for a variety of applications, including applications running on a mobile device. For example, magnetometers may be used that require dead reckoning or headings, such as navigation applications for vehicles, aircraft, watercraft and mobile devices (e.g., smart phones). Sensor configuration 200 can include three magnetic field sensors 202, 204, 206 mounted orthogonally on a board, substrate or other mounting surface. Magnetic sensors 202, 204, 206 can be included in an integrated circuit (IC) package with or without other sensors, such as accelerometers and gyros.

Sensor configuration 200 can be deployed in a host system environment that contains interfering magnetic fields. Since the Earth magnetic field is a weak field (~0.5 Gauss), other magnetic fields can interfere with the accuracy of sensors 202, 204, 206. For example, the sensors 202, 204, 206 may pick or otherwise detect magnetic fields generated by components of the mobile device, which may be referred to as bias offset. A calibration procedure can be deployed to isolate and remove the bias offset. One technique is to determine an offset vector, which can be subtracted from sensor measurements to get accurate measurements of the Earth's magnetic field.

In one exemplary calibration procedure for a 3-axis magnetometer, each heading computation is made with a number of valid X, Y, and Z sensor readings, which can be taken with a minimal delay between each reading. For this sensor configuration, sensors 202, 204, 206 are at right angles with respect to each other and lie level with respect to the Earth's surface. As discussed above, the positive end of the X-axis points to the top of the mobile device, the positive end of the Y-axis points to the right side of the mobile device when facing the screen, and the positive end of the Z-axis points to backside of the mobile device. During calibration, two consecutive sensor readings may be made 180 degrees apart. These measurements can be represented by reading ($R_{x1}$, $R_{y1}$, $R_{z1}$) and reading ($R_{x2}$, $R_{y2}$, $R_{z2}$), which are measurements of the raw magnetic field including Earth's magnetic field plus bias offset. The Earth's magnetic field in any given direction as measured with no interfering field can be represented by values ($E_x$, $E_y$, $E_z$). Magnetic interference can be represented by values ($B_x$, $B_y$, $B_z$). Using these mathematical conventions, the two sensor readings can be represented by $R_{x1} = E_x + B_x$;

$R_{y1} = E_y + B_y$;

$R_{z1} = E_z + B_z$;

$R_{x2} = -E_x + B_x$;

$R_{y2} = -E_y + B_y$; and $R_{z2} = -E_z + B_z$. [4]

Assuming the magnetometer is fixed with respect to the host system (e.g., a magnetometer installed in a mobile phone), the readings ($R_{x1}$, $R_{y1}$, $R_{z1}$) and ($R_{x2}$, $R_{y2}$, $R_{z2}$) taken during calibration may both contain substantially the same interference values ($B_x$, $B_y$, $B_z$). Since the magnetometer readings taken during calibration are 180 degrees apart the readings of the Earth's magnetic field ($E_x$, $E_y$, $E_z$) are equal but opposite in sign ($-E_x$, $-E_y$, $-E_z$). Solving the equations above for $B_x$, $B_y$, and $B_z$ yields:

$B_x = (R_{x1} + R_{x2})/2$, $B_y = (R_{y1} + R_{y2})/2$, and $B_z = (R_{z1} + R_{z2})/2$. [5]

Using the determined bias offsets for each component, the Earth's magnetic field ($E_x$, $E_y$, $E_z$) may be determined by the following equations:

$E_x = R_{x1} - B_x$;

$E_y = R_{y1} - B_y$; and $E_z = R_{z1} - B_z$. [6]

At any given position on Earth, a magnitude $|\vec{E}|$ is substantially constant, regardless of magnetometer orientation. In addition, at any given position on Earth, the inclination angle I between the gravitational vector $\vec{g}$ and the Earth's magnetic field $\vec{E}$ is substantially constant because the orientation of the gravitational acceleration vector $\vec{g}$ and the orientation of geomagnetic field vector $\vec{E}$ are substantially constant.

A heading $\psi$ of the mobile device may be calculated from the determined $\vec{E}$ and $\vec{g}$ using equations [7]-[11] as followed:

$$\theta = -\sin^{-1}\left(\frac{g_x}{|\vec{g}|}\right), \quad [7]$$

$$\phi = \sin^{-1}\left(\frac{g_y}{|\vec{g}|\cos\theta}\right), \quad [8]$$

$$X_h = E_x\cos(\theta) + E_y\sin(\phi)*\sin(\theta) - E_z\cos(\phi)*\sin(\theta) \quad [9]$$

$$Y_h = E_x\cos(\phi) + E_y\sin(\phi) \quad [10]$$

$$\psi = \tan^{-1}\left(\frac{Y_h}{X_h}\right). \quad [11]$$

The heading may be calibrated using other implementations. For example, the heading may also be calibrated based on the orientation of the device obtained from an accelerometer, inclination, GPS, and other types of corrections or calibrations.

If a magnetometer is included in a mobile device, such as a mobile phone, the bias offset may change. For example, if the user docks his mobile device (containing the magnetometer) in his car, magnetic objects in the car could change the local interference, which could result in the calibration offsets becoming invalid. If the offsets are invalid, then the magnetometer can perform a recalibration procedure to generate new offsets. This recalibration procedure can be a tedious process for the user if performed often and may require the user to manipulate the mobile device through a number of angles.

Example Cluster Evaluation of Magnetometer Data

Figure 3:
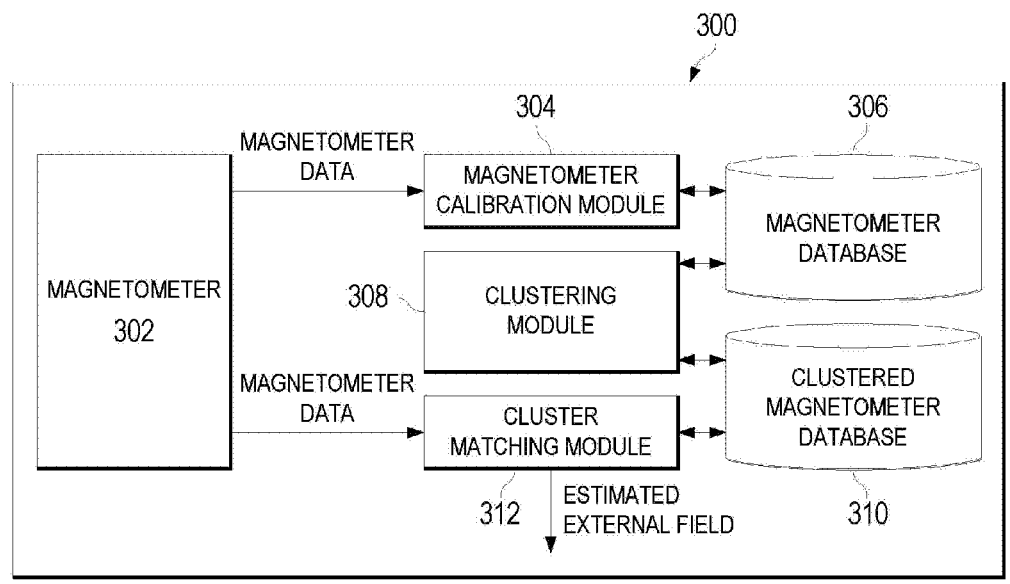
FIG. 3 illustrates an example system for evaluating readings against clustered data.

FIG. 3 illustrates an example system 300 for cluster evaluation of magnetometer data. For example, the system 300 may store calibrated magnetometer data including magnitudes $|\vec{E}|$ of the geomagnetic field, inclination angle I, and associated bias offsets ($B_x$, $B_y$, $B_z$). As illustrated, the system 300 includes a magnetometer 302 for detecting magnetic fields, a magnetometer calibration module 304 for calibrating magnetometer data, magnetometer database 306 for storing calibrated magnetometer data, a clustering module 308 for determining clusters of the calibrated magnetometer data, clustered magnetometer database 310 for storing clustered data, and a cluster matching module 312 for determining whether magnetometer data matches any clusters in the clustered magnetometer database 310. In particular, the magnetometer 302 may be 2-axis or 3-axis magnetometer as discussed with respect to FIG. 2 that measures different components of the raw magnetic field ($R_x$, $R_y$, $R_z$) in, for example, device coordinates.

In response to a recalibration trigger event, the magnetometer 302 may pass magnetometer data to the magnetometer calibration module 304. A recalibration trigger event can be any event that triggers a recalibration procedure on the mobile device. The trigger event can be based on time, location, mobile device activity, an application request, magnetometer data, expiration of a time period, or other events. In connection with recalibration, the magnetometer calibration module 304 may determine bias offsets ($B_x$, $B_y$, $B_z$) based on a raw magnetometer reading ($R_x$, $R_y$, $R_z$) and determine the Earth's magnetic field vector $\vec{E}$ based on the bias offsets ($B_x$, $B_y$, $B_z$) and the raw magnetometer reading ($R_x$, $R_y$, $R_z$) as discussed with respect to FIG. 2. In addition, the magnetometer calibration module 304 may determine the magnitude $|\vec{E}|$ of the geomagnetic field given by Equation [1] and determine the inclination angle I based on the determined geomagnetic field vector $\vec{E}$ and the gravitational vector $\vec{g}$ given by Equation [3]. The magnetometer calibration module 304 may receive the gravitational vector $\vec{g}$ from a location processor, accelerometer readings, or other sources.

Each time a calibration procedure is performed, the magnetometer calibration module 304 may store, in the magnetometer database 306, the magnitude $|\vec{E}|$, the inclination angle I, and associated bias offsets ($B_x$, $B_y$, $B_z$). As previously mentioned, the magnitude $|\vec{E}|$ and the inclination angle I for each location should be theoretically constant regardless of the position of the magnetometer on the Earth or its orientation. If these parameters are not constant then the bias offset may have changed. The magnetometer database 306 may store other parameters such as, for example, temperature, calibration level or timestamp. The calibration level can be used to determine the accuracy or quality of a set of calibration data (e.g., offset values), so that an accurate set of calibration data are not overwritten with a less accurate set of calibration data. The timestamp can be used to manage entries in the magnetometer database 306. For example, the timestamp can be used with an "aging" algorithm for overwriting entries in the magnetometer database 306, so that magnetometer database 306 does not grow too large. In some implementations, entries with the oldest timestamp can be overwritten first. In some implementations, a count is kept for each entry in the magnetometer database 306 and may be incremented each time an entry is used to restore calibration offsets. The entries with the lowest count may be overwritten first. In some implementations, both timestamps and counts can be used for managing the magnetometer database 306.

Figure 4:
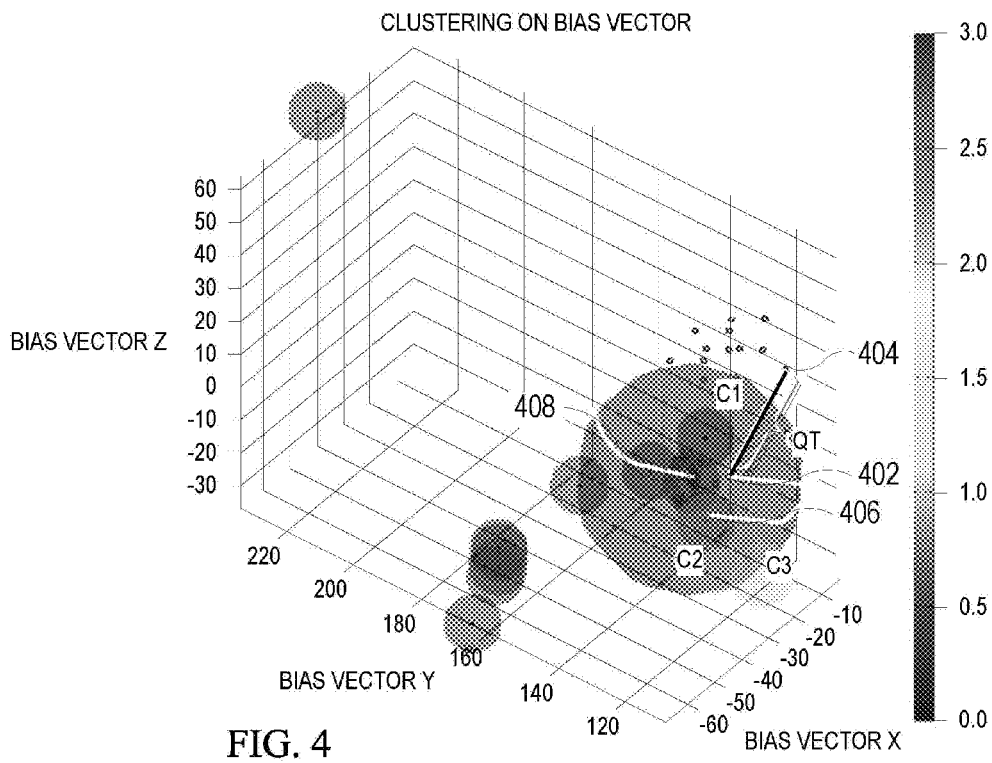
FIG. 4 is a three-dimensional graph illustrating clustering on bias vectors.

The assumption that the magnitude $|\vec{E}|$ and the inclination angle I are should be theoretically constant makes these Earth magnetic field parameters useful for determining the confidence of a match, as described in reference to FIG. 4.

The clustering module 308 can include any software, hardware, firmware, or combination thereof configured to execute a clustering algorithm on the bias offsets ($B_x$, $B_y$, $B_z$) stored in the magnetometer database 306 to form clusters. For example, the clustering module 308 may apply the well-known clustering algorithm known as quality threshold (QT) clustering to entries in the magnetometer database 306 to create clusters of bias offsets. Other clustering algorithms may be used such as connectivity based clustering, centroid-based clustering, distribution-based clustering, density-based clustering, or others. In general, cluster analysis or clustering assigns a set of objects into groups, e.g., clusters, so that the objects in the same cluster are more similar to each other based on one or more metrics than to objects in other clusters. In some implementations, the clusters may be based on the Euclidean distance between bias offset points. Further details of operations of clustering module 308 are described below in reference to FIG. 4.

The clustering module 308 stores the determined clusters in the clustered magnetometer database 310. For each cluster, the clustering module 308 may determine a mean magnitude $C_m$ of the Earth's geomagnetic field $\vec{E}$ as follows:

$$C_m = \frac{\sum_{i=1}^{N} |\vec{E_i}|}{N}, \quad [12]$$

where N is the number of geomagnetic field vectors $\vec{E}$ in the cluster. Also, the clustering module 308 may determine a mean inclination angle $C_a$ of the Earth's geomagnetic field $\vec{E}$ as follows:

$$C_a = \frac{\sum_{i=1}^{N} I_i}{N}, \quad [13]$$

where N is the number of geomagnetic fields $\vec{E}$ in the cluster. In addition, the clustering module 308 may determine a magnitude threshold and an angle threshold. For example, the magnitude threshold may be based on the standard deviation of the magnitudes of the geomagnetic fields $|\vec{E}|$ in the cluster, and the angle threshold may be based on the standard deviation of the inclination angles in the cluster. In addition, the clustering module 308 may determine, for each cluster, a representative bias offset. For example, the clustering module 308 may determine, for each cluster, the geometric center of the cluster as the representative bias offset for the cluster. In some instances, the clustering module 308 determines, for each cluster, the mean of the bias offsets as the center of the cluster. The clustering module 308 may use other statistical measures for determining the center of the cluster such as determining a median of the bias offsets of the cluster.

The cluster matching module 312 can include any software, hardware, firmware, or combination thereof for determining, for each of the clusters in the clustered magnetometer database 310, whether magnetometer data from the magnetometer 302 satisfies the mean magnitude and magnitude threshold and the mean inclination angle and angle threshold. In particular, the cluster matching module 312 may identify the representative bias offset for each of the clusters and determine an estimated external field using the equations [6].

In other words, the cluster matching module 312 may, for each cluster, estimate the geomagnetic field $\vec{E}$ using the following equation:

$$\vec{E} = \vec{R} - \vec{B}, \quad [14]$$

where $\vec{R}$ is the raw magnetic field vector determined by the magnetometer 302 and $\vec{B}$ is the representative bias offset for the cluster. Once determined, the cluster matching module 312 may determine the magnitude $|\vec{E}|$ and the inclination angle I for the estimated geomagnetic field $\vec{E}$ using the equations [1]-[3].

After the magnitude and inclination angle are determined for the estimated geomagnetic field $\vec{E}$ for a cluster, the cluster matching module 312 may determine whether the estimated magnitude is within the range of the mean of the Earth's geomagnetic field to the mean plus the threshold for the cluster. In addition, the cluster matching module 312 may determine whether the estimated inclination angle I is within the range of the mean of the inclination angle to the mean plus the threshold for the cluster. If a match is not found, the cluster matching module 312 iteratively executes these calculations to determine if the estimated geomagnetic field matches any of the clusters in the clustered magnetometer database 310. If a match with a cluster is found, an estimated heading ψ can be computed using the equations [7]-[11], the estimated geomagnetic field $\vec{E}$ determined from the representative bias offset of the matching cluster, and the gravitational vector $\vec{g}$.

Clustering Overview

FIG. 4 is a three-dimensional graph illustrating exemplary clustering techniques of bias offsets. In particular, the diagram is a three-dimensional space based on the bias offsets ($B_x$, $B_y$, $B_z$). The clustering module 308 (as described in reference to FIG. 3) can apply a QT algorithm to create exemplary clusters of bias offsets C1, C2, and C3. The graph shows different clusters C1, C2, and C3 that are illustrated in different shades of gray. Clusters that include only a single point are illustrated in the same shade of gray.

The clustering module 308 can analyze the data in magnetometer database 306 as described above in reference to FIG. 3. The clustering module 308 can identify a first class of bias offsets having a first label (e.g., those labeled as "positive") and bias offsets having a second label (e.g., those labeled as "negative"). The clustering module 308 can identify a specified distance (e.g., a minimum distance) between a first class bias-offset point (e.g., "positive" bias-offset point 402) and a second-class motion feature (e.g., "negative" bias-offset point 404). The clustering module 308 can designate the specified distance as a quality threshold.

The clustering module 308 can select the first bias-offset point 402 to add to the first cluster C1. The clustering module 308 can then identify a second bias-offset point 404 whose distance to the first bias-offset point 402 is less than the quality threshold and, in response to satisfying the threshold, add the second bias-offset point 404 to the first cluster C1. The clustering module 308 can iteratively add bias-offset points to the first cluster C1 until all bias-offset points whose distances to the first bias-offset point 402 are each less than the quality threshold has been added to the first cluster C1.

The clustering module 308 can remove the bias-offset points in C1 from further clustering operations and select another bias-offset point (e.g., bias-offset points 406) to add to a second cluster C2. The clustering module 308 can iteratively add bias-offset points to the second cluster C2 until all bias-offset points whose distances to the bias-offset point 406 are each less than the quality threshold have been added to the second cluster C2. The clustering module 308 can repeat the operations to create clusters C3, C4, and so on until all bias-offset points features are clustered.

The clustering module 308 can generate representative bias offsets for each cluster. In some implementations, the clustering module 308 can designate as the representative bias offsets the geometric center (e.g., mean of the bias offsets in the cluster) of the cluster such as the center 408 for cluster C1. The clustering module 308 may use other techniques for designating a bias-offset point as the representative bias offsets. For example, the clustering module 308 may identify an example that is closest to other samples. In these instances, the clustering module 308 can calculate distances between pairs of bias-offset points in cluster C1 and determine a reference distance for each bias-offset point. The reference distance for a bias-offset point can be a maximum distance between the bias-offset point and another bias-offset point in the cluster. The clustering module 308 can identify a bias-offset point in cluster C1 that has the minimum reference distance and designate the bias-offset point as the bias offsets for cluster C1.

Example Process for Managing Clustered Data

Figure 5:
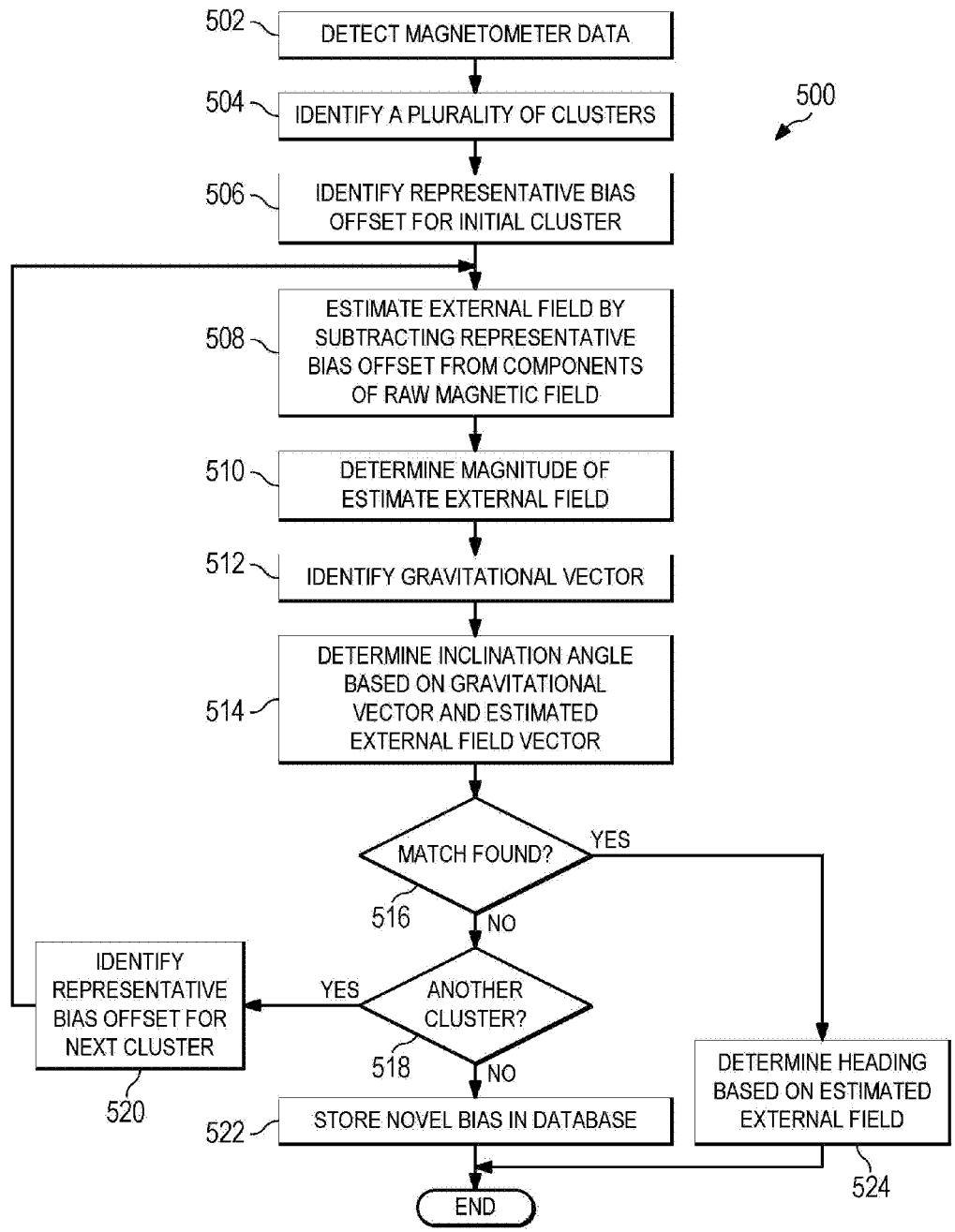
FIG. 5 is a flow chart illustrating an example method for comparing an estimated external field to clustered data.
Figure 6:
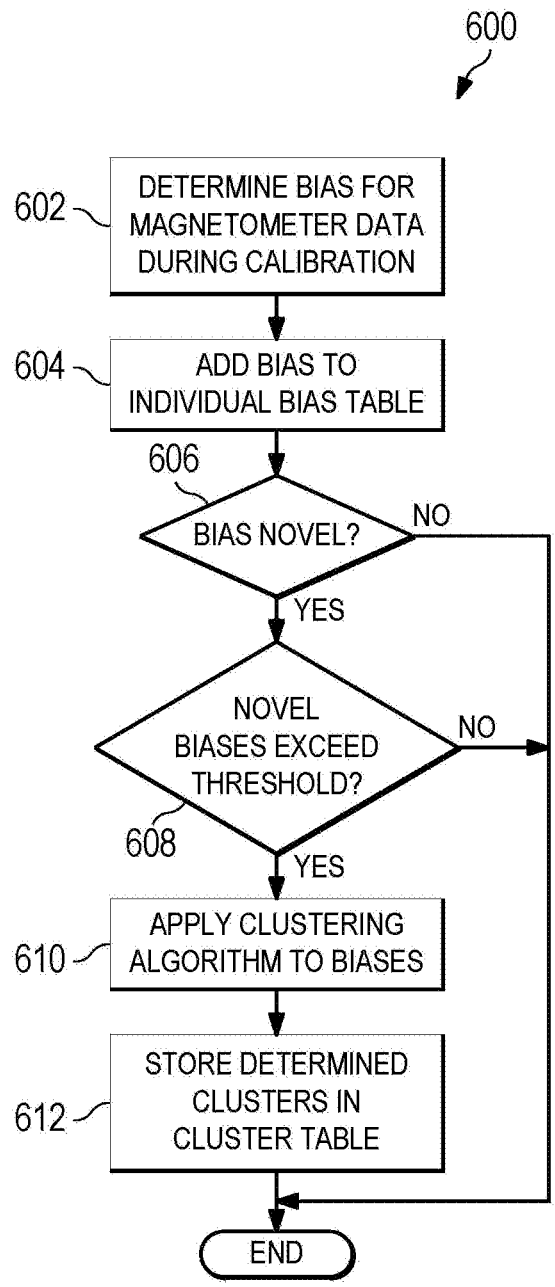
FIG. 6 is a flow chart illustrating an example method for re-execution a clustering algorithm in response to a trigger event.

FIGS. 5 and 6 are flow charts illustrating example methods 500 and 600 for managing clustered data in accordance with some implementations of the present disclosure. Methods 500 and 600 are described with respect to the system 300 of FIG. 3. Though, the associated system may use or implement any suitable technique for performing these and other tasks. These methods are for illustration purposes only and that the described or similar techniques may be performed at any appropriate time, including concurrently, individually, or in combination. In addition, many of the steps in these flowcharts may take place simultaneously and/or in different orders than as shown. Moreover, the associated system may use methods with additional steps, fewer steps, and/or different steps, so long as the methods remain appropriate.

Referring to FIG. 5, method 500 begins at step 502 where magnetometer data for the raw magnetic field is detected. For example, the magnetometer 302 in FIG. 3 may detect magnetic fields in device coordinates and pass the readings to the cluster matching module 312. At step 504, a plurality of clusters is identified. As for the example, the cluster matching module 312 may retrieve or otherwise identify clusters stored in the clustered magnetometer database 310. Next, at step 506, a representative bias offset is identified for an initial cluster. In some implementations, method 500 is iterated through all clusters such that the order may be determined based on any parameter such as timestamp, size, assigned indices, or others. An estimate of the external field is determined by the representative bias offset from the raw magnetic field at step 508. At step 510, the magnitude of the estimated external field is determined.

Next, at step 512, a gravitational vector is identified. The inclination angle is determined, at step 514, based on an estimated external field vector and the gravitational vector. If the magnitude does not match the mean magnitude and threshold of the cluster or the inclination angle for the external field does not match the mean angle and threshold of the cluster at decisional step 516, then execution proceeds to decisional step 518. If another cluster is available for evaluation, then, at step 520, the representative bias offset for the next cluster is identified. If another cluster is not available to evaluate, the novel bias is stored in the database at step 522. Returning to decisional step 516, if both the magnitude of the estimated external field satisfy the magnitude threshold and the inclination angle of the estimated external field satisfy the angle threshold, a heading of the mobile device may be determined based on the estimated external field at step 524.

Referring to FIG. 6, method 600 begins at step 602 where the offset bias for magnetometer data is determined during calibration. For example, the magnetometer 302 may detect multiple points, and the magnetometer calibration module 304 may directly determine the bias offset using the multiple points. At step 604, the determined bias offset is added to the bias table. As for the example, the magnetometer calibration module 304 may store the bias offset in a lookup table stored in the magnetometer database 306. If the determined bias offset is novel at decisional step 606, then execution proceeds to decisional step 608. For example, the magnetometer calibration module 304 may determine that the bias offset does not fall within the existing clusters. If the total number of bias offsets exceed a specified threshold (e.g., 2, 5, 10), then, at step 610, the clustering algorithm applied to the bias offset data stored in the magnetometer database 310 to determine new clusters. At step 612, the determined clusters are stored in a cluster table. As for the example, the clustering module 308 may apply the clustering algorithm on the magnetometer database 306, generate new clusters, and store the new clusters in a table of clustered magnetometer database 310. If either the bias offset falls within a cluster or the number of novel bias offsets have not exceed a threshold, then execution ends.

Figure 7:
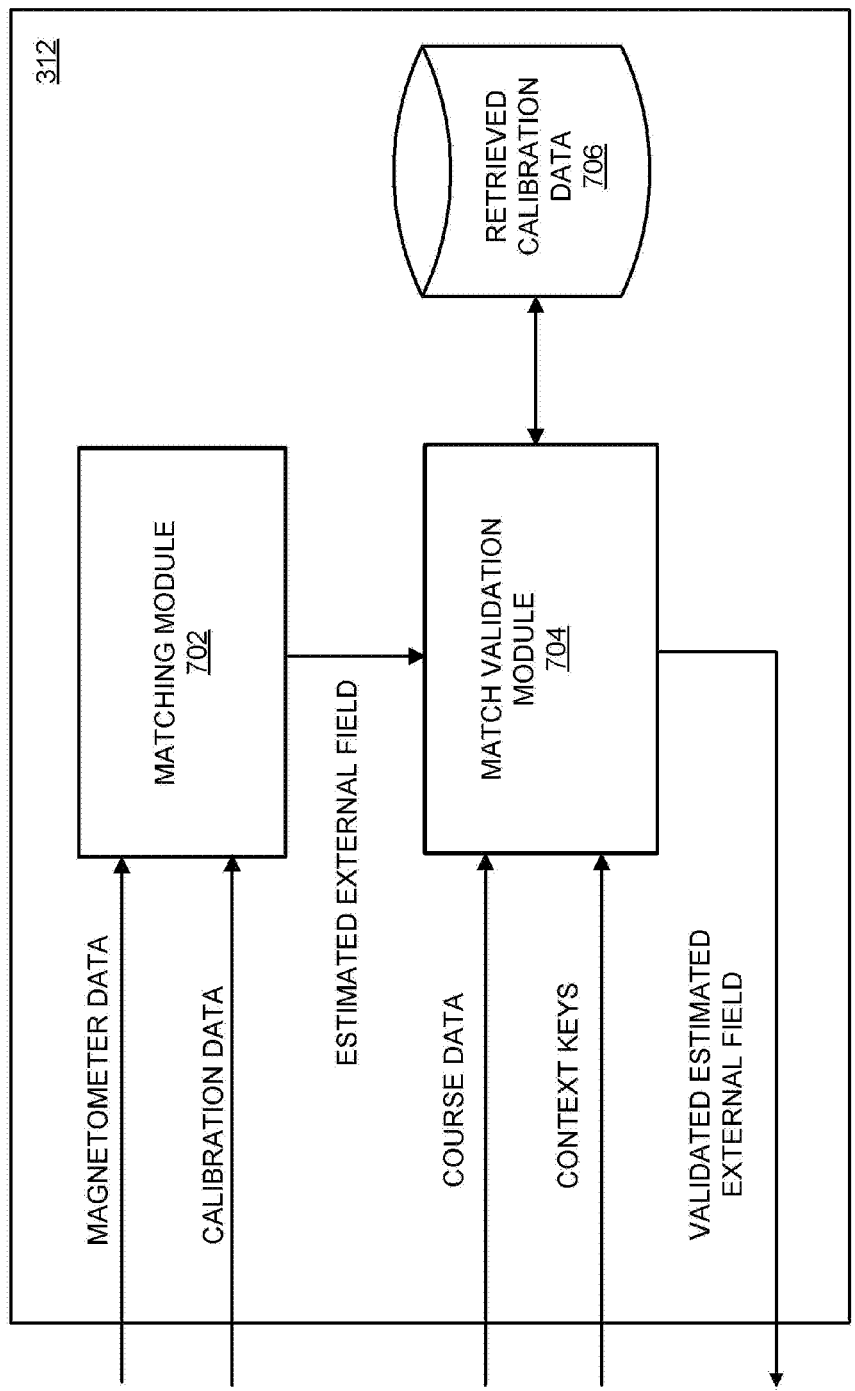
FIG. 7 is a block diagram of the cluster matching module of FIG. 3.

FIG. 7 is a block diagram of the cluster matching module 312 of FIG. 3. In some implementations, cluster matching module 312 includes matching module 702 and match validation module 704. Matching module 702 receives raw magnetometer data and calibrated magnetometer data and generates an estimated external field vector according to process 500, described in reference to FIG. 5.

Match validation module 704 receives positioning system data and one or more context keys. Positioning system data can include a heading for the mobile device. The positioning system can be a Global Positioning System (GPS) receiver onboard the mobile device. Match validation module 704 can be coupled to storage 706 (e.g., memory) which contains previously retrieved calibration data. Erroneous calibrated magnetometer data (e.g., bias offsets) may be retrieved from clustered magnetometer database 310 and applied to the raw magnetometer readings, causing an inaccurate heading for the mobile device to be computed. To prevent this from occurring, the calibration data is validated by match validation module 704.

Validating Against Data from Other Sensors

In some implementations, calibration data for the magnetometer is validated by computing a heading for the mobile device using the retrieved calibration data, as described in reference to FIG. 5. The computed heading is compared to a heading for the mobile device provided by a positioning system (e.g., GPS) on board the mobile device. If the difference between the two headings exceeds a specified threshold, the retrieved data is invalid and a new set of magnetometer calibration data is retrieved from clustered magnetometer database 310. If the difference between the two headings does not exceed the specified threshold, the retrieved calibration data is valid and can be used to compute the heading of the mobile device.

Validating Against Previously Retrieved Calibration Data

In another example scenario, a currently retrieved calibrated data is compared with a previously retrieved calibrated data to determine whether the currently retrieved calibrated data is valid. For example, calibrated data can be retrieved from the clustered magnetometer database 310 at specified rate or schedule. The calibration data can be stored in database 706 of cluster matching module 312. If the time interval between retrievals is small, there is an expectation that the calibration data would not deviate by a large amount between retrievals. By comparing the currently retrieved calibration data with previously retrieved calibration data, the currently retrieved calibration data can be validated or invalidated depending on the outcome of the comparing. For example, if the difference between the currently retrieved calibration data and the previously retrieved calibration data exceeds a threshold, then the currently retrieved calibration data is valid. Otherwise, the currently retrieve calibration data is not valid.

Context Keys

In some implementations, one or more context keys can be used to retrieve calibration data. As previously, described the mean magnitude of the Earth's geomagnetic field and the mean inclination angle can be used to retrieve calibration data from database 310. In addition to these retrieval keys, a context key can be used to better constrain the calibration data retrieval. One example context key is a mounted state key, which indicates that the mobile device was in a mounted state in a vehicle when the calibration occurred. When the calibration data is stored in database 310, data indicating the mounted state (e.g., a flag) is stored together with the mean magnitude and mean inclination angle. When a database retrieval is requested, the mean magnitude, mean inclination angle and mounted state flag can be used in the matching process performed by matching module 702.

Another example context key is an in-transit key, which indicates that the mobile device was in transit (e.g., on a train) when the calibration occurred. In some implementations, database 310 can be divided into sections according to context keys or separate databases can be used for different contexts. For example, calibration data for a mounted mobile device can be in one section of a database or a different database then data for a mobile device that is in transit.

Figure 8:
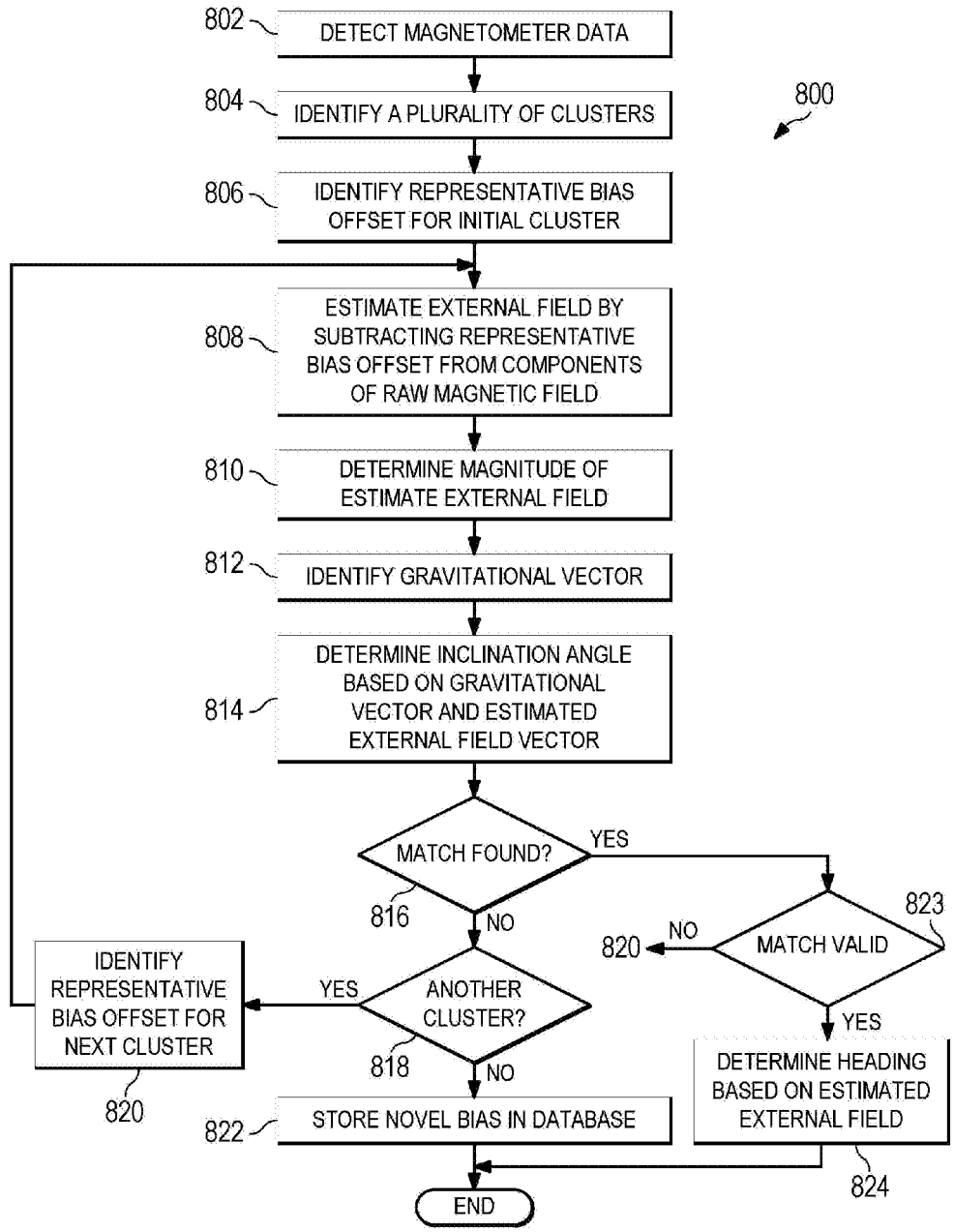
FIG. 8 is a flow chart illustrating an example method for validating calibration data retrieved from a calibration database.

FIG. 8 is a flow chart illustrating an example method 800 for comparing an estimated external field to clustered data, including validating the clustered data. Steps 802, 804, 806, 808, 810, 812 and 814 in method 800 are similar to steps 502, 504, 506, 508, 510, 512 and 514 in method 500 shown in FIG. 5, except for the addition of step 823. If a match is found at step 816, then a heading is determined based on the external magnetic field 824. Otherwise, method 800 continues to step 820 and identifies another representative bias offset for a next cluster.

Example Mobile Device Architecture

FIG. 9 is a block diagram of exemplary architecture 900 of a mobile device including an electronic magnetometer. The mobile device 900 can include memory interface 902, one or more data processors, image processors and/or central processing units 904, and peripherals interface 906. Memory interface 902, one or more processors 904 and/or peripherals interface 906 can be separate components or can be integrated in one or more integrated circuits. Various components in mobile device architecture 900 can be coupled together by one or more communication buses or signal lines.

Sensors, devices, and subsystems can be coupled to peripherals interface 906 to facilitate multiple functionalities. For example, motion sensor 910, light sensor 912, and proximity sensor 914 can be coupled to peripherals interface 906 to facilitate orientation, lighting, and proximity functions of the mobile device. Location processor 915 (e.g., GPS receiver) can be connected to peripherals interface 906 to provide geopositioning. Electronic magnetometer 916 (e.g., an integrated circuit chip) can also be connected to peripherals interface 906 to provide data that can be used to determine the direction of magnetic North.

Camera subsystem 920 and Optical sensor 922, e.g., a charged coupled device (CCD) or a complementary metal-oxide semiconductor (CMOS) optical sensor, can be utilized to facilitate camera functions, such as recording photographs and video clips.

Communication functions can be facilitated through one or more wireless communication subsystems 924, which can include radio frequency receivers and transmitters and/or optical (e.g., infrared) receivers and transmitters. The specific design and implementation of communication subsystem 924 can depend on the communication network(s) over which the mobile device is intended to operate. For example, the mobile device may include communication subsystems 924 designed to operate over a GSM network, a GPRS network, an EDGE network, a Wi-Fi or WiMax network, and a Bluetooth™ network. In particular, wireless communication subsystems 924 may include hosting protocols such that the mobile device may be configured as a base station for other wireless devices.

Audio subsystem 926 can be coupled to speaker 928 and microphone 930 to facilitate voice-enabled functions, such as voice recognition, voice replication, digital recording, and telephony functions. Note that speaker 928 could introduce magnetic interference to the magnetometer, as described in reference to FIGS. 1-2.

I/O subsystem 940 can include touch surface controller 942 and/or other input controller(s) 944. Touch surface controller 942 can be coupled to touch surface 946. Touch surface 946 and touch surface controller 942 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with touch surface 946.

Other input controller(s) 944 can be coupled to other input/control devices 948, such as one or more buttons, rocker switches, thumb-wheel, infrared port, USB port, docking station and/or a pointer device such as a stylus. The one or more buttons (not shown) can include an up/down button for volume control of speaker 928 and/or microphone 930.

In one implementation, a pressing of the button for a first duration may disengage a lock of touch surface 946; and a pressing of the button for a second duration that is longer than the first duration may turn power to the mobile device on or off. The user may be able to customize a functionality of one or more of the buttons. Touch surface 946 can be used to implement virtual or soft buttons and/or a keyboard.

In some implementations, the mobile device can present recorded audio and/or video files, such as MP3, AAC, and MPEG files. In some implementations, the mobile device can include the functionality of an MP3 player.

Memory interface 902 can be coupled to memory 950. Memory 950 can include high-speed random access memory and/or non-volatile memory, such as one or more magnetic disk storage devices, one or more optical storage devices, and/or flash memory (e.g., NAND, NOR). Memory 950 can store operating system 952, such as Darwin, RTXC, LINUX, UNIX, OS X, WINDOWS, or an embedded operating system such as VxWorks. Operating system 952 may include instructions for handling basic system services and for performing hardware dependent tasks. In some implementations, operating system 952 can be a kernel (e.g., UNIX kernel).

Memory 950 may also store communication instructions 954 to facilitate communicating with one or more additional devices, one or more computers and/or one or more servers. Memory 950 may include graphical user interface instructions 956 to facilitate graphic user interface processing; sensor processing instructions 958 to facilitate sensor-related processing and functions; phone instructions 960 to facilitate phone-related processes and functions; electronic messaging instructions 962 to facilitate electronic-messaging related processes and functions; web browsing instructions 964 to facilitate web browsing-related processes and functions; media processing instructions 966 to facilitate media processing-related processes and functions; GPS/Navigation instructions 968 to facilitate GPS and navigation-related processes and instructions; camera instructions 970 to facilitate camera-related processes and functions; magnetometer data 972 and calibration instructions 974 to facilitate magnetometer calibration, as described in reference to FIGS. 1-8.

Memory 950 may also store other software instructions (not shown), such as Web video instructions to facilitate web video-related processes and functions; and/or web shopping instructions to facilitate web shopping-related processes and functions. In some implementations, media processing instructions 966 are divided into audio processing instructions and video processing instructions to facilitate audio processing-related processes and functions and video processing-related processes and functions, respectively. An activation record and International Mobile Equipment Identity (IMEI) or similar hardware identifier can also be stored in memory 950.

Each of the above identified instructions and applications can correspond to a set of instructions for performing one or more functions described above. These instructions need not be implemented as separate software programs, procedures, or modules. Memory 950 can include additional instructions or fewer instructions. Furthermore, various functions of the mobile device may be implemented in hardware and/or in software, including in one or more signal processing and/or application specific integrated circuits.

The features described may be implemented in digital electronic circuitry or in computer hardware, firmware, software, or in combinations of them. The features may be implemented in a computer program product tangibly embodied in an information carrier, e.g., in a machine-readable storage device, for execution by a programmable processor; and method steps may be performed by a programmable processor executing a program of instructions to perform functions of the described implementations by operating on input data and generating output.

The described features may be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language (e.g., Objective-C, Java), including compiled or interpreted languages, and it may be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer may communicate with mass storage devices for storing data files. These mass storage devices may include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, ASICs (application-specific integrated circuits).

To provide for interaction with an author, the features may be implemented on a computer having a display device such as a CRT (cathode ray tube) or LCD (liquid crystal display) monitor for displaying information to the author and a keyboard and a pointing device such as a mouse or a trackball by which the author may provide input to the computer.

The features may be implemented in a computer system that includes a back-end component, such as a data server or that includes a middleware component, such as an application server or an Internet server, or that includes a front-end component, such as a client computer having a graphical user interface or an Internet browser, or any combination of them. The components of the system may be connected by any form or medium of digital data communication such as a communication network. Examples of communication networks include a LAN, a WAN and the computers and networks forming the Internet.

The computer system may include clients and servers. A client and server are generally remote from each other and typically interact through a network. The relationship of client and server arises by virtue of computer programs running on the respective computers and having a client-server relationship to each other.

One or more features or steps of the disclosed embodiments may be implemented using an Application Programming Interface (API). An API may define on or more parameters that are passed between a calling application and other software code (e.g., an operating system, library routine, function) that provides a service, that provides data, or that performs an operation or a computation.

The API may be implemented as one or more calls in program code that send or receive one or more parameters through a parameter list or other structure based on a call convention defined in an API specification document. A parameter may be a constant, a key, a data structure, an object, an object class, a variable, a data type, a pointer, an array, a list, or another call. API calls and parameters may be implemented in any programming language. The programming language may define the vocabulary and calling convention that a programmer will employ to access functions supporting the API.

In some implementations, an API call may report to an application the capabilities of a device running the application, such as input capability, output capability, processing capability, power capability, communications capability, etc.

A number of implementations have been described. Nevertheless, it will be understood that various modifications may be made. The systems and techniques presented herein are also applicable to other electronic text such as electronic newspaper, electronic magazine, electronic documents etc. Elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method comprising:
   receiving a reading from a magnetometer of a mobile device;
   selecting a cluster from a plurality of clusters of bias offsets generated from previously-calibrated readings, wherein the selected cluster has a representative bias offset, a mean of magnitudes in the selected cluster, and a magnitude threshold;
   estimating an external magnetic field based on the reading and the representative bias offset for the selected cluster;
   determining whether a magnitude of the estimated external field is within a magnitude range defined by the mean magnitude and the mean magnitude plus the magnitude threshold;
   determining a gravitational vector;
   determining an inclination angle between the gravitational vector and the estimated magnetic field;
   determining whether the inclination angle is within an angle range defined by a mean inclination angle for the selected cluster and the mean angle plus an angle threshold;
   determining the magnitude of the estimated external field matches the magnitude range and the inclination angle matches the angle range;
   determining a first heading for the mobile device using the estimated external field;
   comparing the first heading with a second heading obtained from data provided by a location processor of the mobile device; and
   validating the first heading in response to the comparing,
   where the method is performed by one or more hardware processors.

2. The method of claim 1, further comprising:
   determining the estimated external field does not match the magnitude range of the cluster;
   iteratively estimating an external field using representative bias offsets for different clusters in the plurality of clusters; and
   for each iteration, determining whether the estimated external field matches a magnitude range for a cluster selected during that iteration.

3. The method of claim 1, further comprising:
   receiving calibrated magnetometer data including a bias offset;
   comparing the bias offset to the plurality of clusters;

determining the bias offset does not match any cluster in the plurality of clusters; and identifying the bias offset as novel.

4. The method of claim 3, further comprising:

determining that a number of novel bias offsets exceeds a specified number; and automatically applying a clustering technique to historical magnetometer data to generate new clusters of bias offsets.

5. The method of claim 1, wherein the plurality of clusters are formed using a quality threshold clustering.

6. The method of claim 1, wherein the external magnetic field is estimated by subtracting the representative bias offset for the selected cluster from the readings.

7. The method of claim 1, wherein the magnitude threshold is based on a standard deviation of magnitudes in the selected cluster.

8. The method of claim 1, where the location processor is a satellite positioning system.

9. A method comprising:

receiving a reading from a magnetometer of a mobile device;

selecting, at a first time, a first cluster from a plurality of clusters of bias offsets generated from previously-calibrated readings, wherein the selected first cluster has a first representative bias offset, a first mean of magnitudes in the selected first cluster, and a first magnitude threshold;

selecting, at a second time, a second cluster from a plurality of clusters of bias offsets generated from previously-calibrated readings, wherein the selected second cluster has a second representative bias offset, a second mean of magnitudes in the selected second cluster, and a second magnitude threshold;

comparing the first and second representative bias offset;

validating the second representative bias offset based on the comparing;

estimating an external magnetic field based on the reading and the second representative bias offset for the selected second cluster;

determining whether a magnitude of the estimated external field is within a magnitude range defined by the second mean magnitude and the second mean magnitude plus the second magnitude threshold;

determining a gravitational vector;

determining an inclination angle between the gravitational vector and the estimated magnetic field;

determining whether the inclination angle is within an angle range defined by a mean inclination angle for the selected cluster and the mean angle plus an angle threshold;

determining the magnitude of the estimated external field matches the magnitude range and the inclination angle matches the angle range; and determining a heading for the mobile device using the estimated external field, where the method is performed by one or more hardware processors.

10. A computer-implemented method, comprising:

receiving a reading from a magnetometer of a mobile device;

selecting a cluster from a plurality of clusters of bias offsets generated from previously-calibrated readings, wherein the selected cluster has a representative bias offset, a mean of magnitudes in the selected cluster, and a magnitude threshold, where the selecting uses a context key;

estimating an external magnetic field based on the reading and the representative bias offset for the selected cluster;

determining whether a magnitude of the estimated external field is within a magnitude range defined by the mean magnitude and the mean magnitude plus the magnitude threshold;

determining a gravitational vector;

determining an inclination angle between the gravitational vector and the estimated magnetic field;

determining whether the inclination angle is within an angle range defined by a mean inclination angle for the selected cluster and the mean angle plus an angle threshold;

determining the magnitude of the estimated external field matches the magnitude range and the inclination angle matches the angle range; and determining a first heading for the mobile device using the estimated external field, where the method is performed by one or more hardware processors.

11. The method of claim 10, where the context key indicates that the mobile device was mounted in a vehicle at the time of the previously calibrated readings.

12. A system comprising:

one or more processors;

memory coupled to the one or more processors and configured for storing instructions, which, when executed by the one or more processors, causes the one or more processors to perform operations comprising:

receiving a reading from a magnetometer of a mobile device;

selecting a cluster from a plurality of clusters of bias offsets generated from previously-calibrated readings, wherein the selected cluster has a representative bias offset, a mean of magnitudes in the selected cluster, and a magnitude threshold;

estimating an external magnetic field based on the reading and the representative bias offset for the selected cluster;

determining whether a magnitude of the estimated external field is within a magnitude range defined by the mean magnitude and the mean magnitude plus the magnitude threshold;

determining a gravitational vector;

determining an inclination angle between the gravitational vector and the estimated magnetic field;

determining whether the inclination angle is within an angle range defined by a mean inclination angle for the selected cluster and the mean angle plus an angle threshold;

determining the magnitude of the estimated external field matches the magnitude range and the inclination angle matches the angle range;

determining a first heading for the mobile device using the estimated external field;

comparing the first heading with a second heading obtained from data provided by a location processor of the mobile device; and validating the first heading in response to the comparing.

13. The system of claim 12, further comprising:

determining the estimated external field does not match the magnitude range of the cluster;

iteratively estimating an external field using representative bias offsets for different clusters in the plurality of clusters; and for each iteration, determining whether the estimated external field matches a magnitude range for a cluster selected during that iteration.

14. The method of claim 12, further comprising:
receiving calibrated magnetometer data including a bias offset;
comparing the bias offset to the plurality of clusters;
determining the bias offset does not match any cluster in the plurality of clusters; and
identifying the bias offset as novel.

15. The system of claim 14, further comprising:
determining that a number of novel bias offsets exceeds a specified number; and
automatically applying a clustering technique to historical magnetometer data to generate new clusters of bias offsets.

16. The system of claim 12, wherein the plurality of clusters are formed using a quality threshold clustering.

17. The system of claim 12, wherein the external magnetic field is estimated by subtracting the representative bias offset for the selected cluster from the readings.

18. The system of claim 12, wherein the magnitude threshold is based on a standard deviation of magnitudes in the selected cluster.

19. The system of claim 12, where the location processor is a satellite positioning system.

20. A system comprising:
one or more processors;
memory coupled to the one or more processors and configured for storing instructions, which, when executed by the one or more processors, causes the one or more processors to perform operations comprising:
receiving a reading from a magnetometer of a mobile device;
selecting, at a first time, a first cluster from a plurality of clusters of bias offsets generated from previously-calibrated readings, wherein the selected first cluster has a first representative bias offset, a first mean of magnitudes in the selected first cluster, and a first magnitude threshold;
selecting, at a second time, a second cluster from a plurality of clusters of bias offsets generated from previously-calibrated readings, wherein the selected second cluster has a second representative bias offset, a second mean of magnitudes in the selected second cluster, and a second magnitude threshold;
comparing the first and second representative bias offset;
validating the second representative bias offset based on the comparing;
estimating an external magnetic field based on the reading and the second representative bias offset for the selected second cluster;
determining whether a magnitude of the estimated external field is within a magnitude range defined by the second mean magnitude and the second mean magnitude plus the second magnitude threshold;
determining a gravitational vector;
determining an inclination angle between the gravitational vector and the estimated magnetic field;
determining whether the inclination angle is within an angle range defined by a mean inclination angle for the selected cluster and the mean angle plus an angle threshold;
determining the magnitude of the estimated external field matches the magnitude range and the inclination angle matches the angle range; and
determining a heading for the mobile device using the estimated external field.

21. A system comprising:
one or more processors;
memory coupled to the one or more processors and configured for storing instructions, which, when executed by the one or more processors, causes the one or more processors to perform operations comprising:
receiving a reading from a magnetometer of a mobile device;
selecting a cluster from a plurality of clusters of bias offsets generated from previously-calibrated readings, wherein the selected cluster has a representative bias offset, a mean of magnitudes in the selected cluster, and a magnitude threshold, where the selecting uses a context key;
estimating an external magnetic field based on the reading and the representative bias offset for the selected cluster;
determining whether a magnitude of the estimated external field is within a magnitude range defined by the mean magnitude and the mean magnitude plus the magnitude threshold;
determining a gravitational vector;
determining an inclination angle between the gravitational vector and the estimated magnetic field;
determining whether the inclination angle is within an angle range defined by a mean inclination angle for the selected cluster and the mean angle plus an angle threshold;
determining the magnitude of the estimated external field matches the magnitude range and the inclination angle matches the angle range; and
determining a first heading for the mobile device using the estimated external field.

* * * * *